(12) United States Patent
Baek

(10) Patent No.: US 12,744,517 B2
(45) Date of Patent: Sep. 22, 2026

(54) APPARATUS WITH SELF CALIBRATION IN ISOLATED COMMUNICATION AND METHOD THEREOF

(71) Applicant: HYUNDAI MOBIS CO., LTD., Seoul (KR)

(72) Inventor: Seung Wuk Baek, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 958 days.

(21) Appl. No.: 18/077,883

(22) Filed: Dec. 8, 2022

(65) Prior Publication Data

US 2024/0080020 A1 Mar. 7, 2024

(30) Foreign Application Priority Data

Sep. 2, 2022 (KR) ........................ 10-2022-0111348

(51) Int. Cl.

*H03K 3/0233* (2006.01)
*H02J 7/60* (2026.01)
*H02J 7/82* (2026.01)

(52) U.S. Cl.

CPC .......... *H03K 3/02337* (2013.01); *H02J 7/663* (2026.01); *H02J 7/82* (2026.01)

(58) Field of Classification Search

CPC ............... H03K 17/945; H03K 17/962; H03K 17/9622; H03K 2017/9706; H03K 2217/94068; H03K 3/033; H03K 5/01; H03K 17/687; H03K 3/02337; H03K 17/9535; H03K 17/955; H03K 19/1737; H03K 7/02; H03K 7/08; H03K 17/063; H03K 17/18; H03K 17/567;

(Continued)

(56) References Cited

U.S. PATENT DOCUMENTS

2005/0288893 A1 12/2005 Gassner
2018/0056808 A1* 3/2018 Gibson ................ H02J 7/0019

(Continued)

FOREIGN PATENT DOCUMENTS

JP 2011-30422 A 2/2011
JP 2013-522932 A 6/2013

(Continued)

OTHER PUBLICATIONS

Japanese Office Action issued on Jan. 9, 2024, in counterpart Japanese Patent Application No. 2022-185267 (6 pages in Japanese).

(Continued)

*Primary Examiner* — John W Poos
(74) *Attorney, Agent, or Firm* — NSIP Law

(57) ABSTRACT

An apparatus for self-calibration in isolated communication is included. A plurality of integrated circuits perform isolated communication with respect to each other. A microcomputer is configured to output a self-calibration instruction to the plurality of integrated circuits when a predetermined condition is met or in response to at least one of a periodic instruction or an aperiodic instruction. A plurality of processors are respectively provided in a corresponding one of the plurality of integrated circuits. Each of the processors being configured to perform a self-calibration operation to transmission parts and receiving parts in the corresponding integrated circuit.

18 Claims, 9 Drawing Sheets

(58) Field of Classification Search
CPC ........ H03K 19/017509; H03K 5/1534; H03M 1/12; H03M 13/1102; H03M 13/353; H03M 1/66; H03M 1/1255; H03M 1/126; H03M 5/02; H03M 5/04; H03M 7/28; H03M 7/3059; H03M 7/3066; H03M 7/3077; H03M 7/707; H03M 1/34; H03M 11/24
See application file for complete search history.

(56) References Cited

U.S. PATENT DOCUMENTS

| | | | | |
|---|---|---|---|---|
| 2019/0205218 | A1* | 7/2019 | Bailey | G06F 11/1658 |
| 2020/0379534 | A1* | 12/2020 | Zahir | H02J 7/0048 |
| 2021/0036533 | A1* | 2/2021 | Sporck | H02J 7/0071 |

FOREIGN PATENT DOCUMENTS

| | | | |
|---|---|---|---|
| KR | 10-2015-0097467 | A | 8/2015 |
| KR | 10-2018-0086539 | A | 8/2018 |
| KR | 10-2021-0059464 | A | 5/2021 |
| KR | 10-2402641 | B1 | 5/2022 |
| WO | WO 2008/056739 | A1 | 5/2008 |

OTHER PUBLICATIONS

Korean Office Action Issued on Apr. 8, 2024, in Counterpart Korean Patent Application No. 10-2022-0111348 (5 Pages in Korean).

* cited by examiner

121
IC # [N+1]
Processor
SIGNAL DETECTOR &
EDGE / HYSTERESIS CTRL
TX0
RX0
TX1
RX1
SW1
SW2
SW3
SW4
SW5
SW6
SW7
SW8
P0
M0
P1
M1
C6
SL6
C5
SL5
C1
C2
SL1
SL2
C4
SL4
C3
SL3
P0
M0
P1
M1
SW1
SW2
SW3
SW4
SW5
SW6
SW7
SW8
IC # [N]
TX0
RX0
TX1
RX1
121
Processor
SIGNAL DETECTOR &
EDGE / HYSTERESIS CTRL
110
Microcomputer

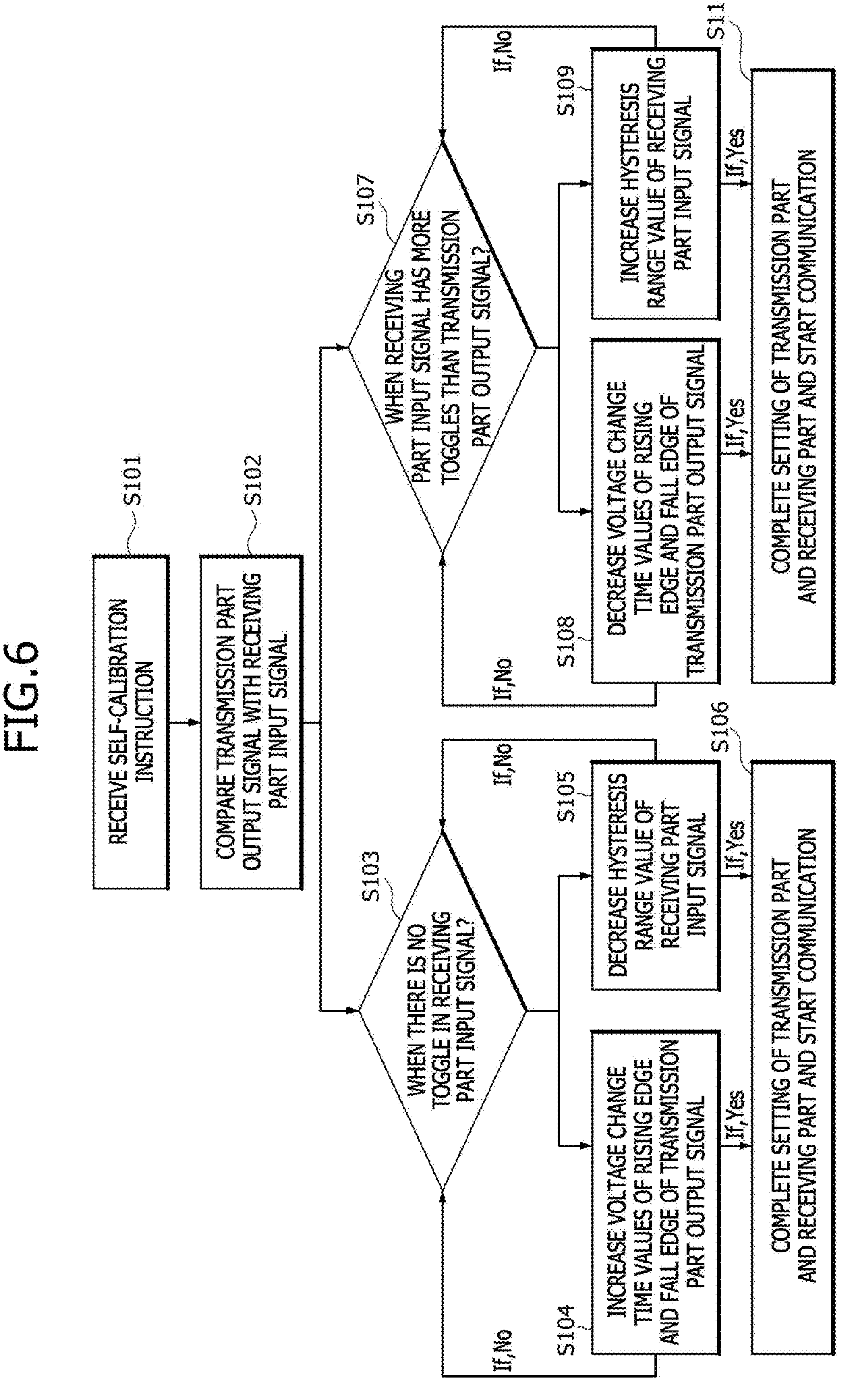
FIG.6
S101
RECEIVE SELF-CALIBRATION INSTRUCTION
S102
COMPARE TRANSMISSION PART OUTPUT SIGNAL WITH RECEIVING PART INPUT SIGNAL
S103
WHEN THERE IS NO TOGGLE IN RECEIVING PART INPUT SIGNAL?
S104
INCREASE VOLTAGE CHANGE TIME VALUES OF RISING EDGE AND FALL EDGE OF TRANSMISSION PART OUTPUT SIGNAL
S105
DECREASE HYSTERESIS RANGE VALUE OF RECEIVING PART INPUT SIGNAL
If,No
If,No
If,Yes
If,Yes
S106
COMPLETE SETTING OF TRANSMISSION PART AND RECEIVING PART AND START COMMUNICATION
S107
WHEN RECEIVING PART INPUT SIGNAL HAS MORE TOGGLES THAN TRANSMISSION PART OUTPUT SIGNAL?
S108
DECREASE VOLTAGE CHANGE TIME VALUES OF RISING EDGE AND FALL EDGE OF TRANSMISSION PART OUTPUT SIGNAL
S109
INCREASE HYSTERESIS RANGE VALUE OF RECEIVING PART INPUT SIGNAL
If,No
If,No
If,Yes
If,Yes
S110
COMPLETE SETTING OF TRANSMISSION PART AND RECEIVING PART AND START COMMUNICATION

APPARATUS WITH SELF CALIBRATION IN ISOLATED COMMUNICATION AND METHOD THEREOF

CROSS-REFERENCE TO RELATED APPLICATION

This application claims priority from and the benefit under 35 USC § 119(a) of Korean Patent Application No. 10-2022-0111348, filed on Sep. 2, 2022, which is hereby incorporated by reference for all purposes as if set forth herein.

BACKGROUND

Field

Embodiments of the present disclosure relate to an apparatus for self-calibration in communication and a method thereof, and more particularly, to an apparatus able to prevent and compensate for data loss by self-calibration in response to changes in the external environment in isolated communication between integrated circuits (ICs) and a method thereof.

Description of the Related Art

In general, a vehicle battery being provided with a battery management system (BMS) is essential, since the vehicle battery requires cell balancing.

Here, the battery management system has a communication function to obtain information, such as battery cell voltages, charge/discharge capacitance, and current, in a cell balancing process.

In addition, the battery management system performs isolated communication using an isolation device (e.g., a transformer or a capacitor) due to the differences in voltage between battery modules.

For example, in general, as illustrated in FIG. 1, a fuel cell system includes a plurality of integrated circuits IC #1 to IC #N for sensing battery voltages, insolation devices TF and C connecting the plurality of integrated circuits IC #1 to IC #N, and a microcomputer 110 performing control by communicating with the plurality of integrated circuits IC #1 to IC #N.

Here, it is important for the fuel cell system to accurately sense the voltage of the vehicle battery. It is also important to transfer instructions and battery information (e.g., battery cell voltages, charge/discharge capacitance, and current) via the microcomputer 110.

However, since the transmission and the reception of the battery information have different voltages according to battery characteristics, each of the integrated circuits IC #1 to IC #N is required to be isolated to prevent burning. Each of the integrated circuits IC #1 to IC #N prevents burning caused by different voltages or noise by performing insolation using the transformer or the capacitor.

However, when data is transmitted outside of the integrated circuits IC #1 to IC #N, a phenomenon in which a pulse signal is converted into a peak signal (i.e., an alternating current (AC) signal) due to the isolating characteristic of the isolation device occurs as illustrated in FIG. 2A.

Here, the size of the peak signal is determined by current, capacitor capacitance, and a change in a voltage for a specific time due to a differential formula.

However, the capacitance capacitor may change in response to changes in the external environment (e.g., temperature) (see FIG. 2B). That is, FIG. 2B is an example diagram illustrating changes in the capacitance of a vehicle capacitor (e.g., X7R) according to the temperature. It can be appreciated that there is a change (or difference) of about 15% between the maximum capacitance and the minimum capacitance of the capacitor. This change has an effect on capacitor capacitance C according to the differential formula:

$$I=C*dV/dt.$$

As described above, changes in the external environment (e.g., temperature) have an effect on the magnitude of the peak signal. Thus, there is a possibility that the receiving integrated circuit (IC) receiving the peak signal may have a data error.

That is, in the related art, when isolated communication is performed, the characteristics of the isolation device may be changed due to changes in the external environment such as a temperature change, thereby causing loss in data to be transmitted or received.

Accordingly, there is demand for a technology able to prevent and compensate for data loss by self-calibration when there is a possibility of data loss caused by changes in the characteristics of the isolation device due to changes in the external environment in isolated communication between integrated circuits (ICs).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, here is provided apparatus, including a plurality of integrated circuits configured to perform isolated communication with respect to each other, a microcomputer configured to output a self-calibration instruction to the plurality of integrated circuits when a predetermined condition is met or in response to one of a periodic instruction or aperiodic instruction and a plurality of processors each provided in a corresponding one of the plurality of integrated circuits, the plurality of processors being configured to execute instructions to perform a self-calibration operation to transmission parts and receiving parts in the corresponding integrated circuit.

The self-calibration instruction may be input and the instructions may also include instructions to change a level of a receiving part input signal by controlling voltage change times of a rising edge of a transmission part output signal and a falling edge of the transmission part output signal.

When the self-calibration instruction is input, the instructions may also control a hysteresis range for a receiving part input signal.

When the self-calibration instruction is input, the instructions may also include instructions to select a transmission part and a receiving part connected to a signal line in which an error occurrence is not detected, from among the transmission parts and the receiving parts, in response to a current external environment, by controlling switches connecting the transmission parts and the receiving parts inside one of the plurality of integrated circuits to different signal lines.

The plurality of integrated circuits may include a pair of first transmission parts and a pair of first receiving parts, a pair of second transmission parts and a pair of second receiving parts, and a switch device configured to select and connect one of the first transmission parts and the second transmission parts and one of the first receiving parts and the second receiving parts to an isolated communication signal line.

The plurality of integrated circuits may include a first isolated communication integrated circuit and a second isolated communication integrated circuit connected to each other through a first pair of communication ports and a first signal line and a second signal line, a first isolation device and a second isolation device may be provided at respective intermediate points of the first signal line and the second signal line, a third signal line and a fourth signal line connected to a second pair of communication ports of the first isolated communication integrated circuit, the third signal line and the fourth signal line being connected to respective first points of the first signal line and the second signal line upstream of the first isolation device and the second isolation device through a third capacitor and a fourth capacitor, respectively, and a fifth signal line and a sixth signal line connected to a third pair of communication ports of the second isolated communication integrated circuit, the fifth signal line and the sixth signal line being connected to respective second points of the first signal line and the second signal line downstream of the first isolation device and the second isolation device, respectively, through a fifth capacitor and a sixth capacitor.

Each of the first transmission parts and the second transmission parts may include an edge time control circuit configured to control voltage change times of a rising edge of an output signal and a falling edge of the output signal.

Each of the first receiving parts and the second receiving parts may include a hysteresis range control circuit configured to control a hysteresis range for a received signal.

When the self-calibration instruction is input, the instructions may further include instructions to transmit and receive predetermined reference signals, compare a transmission part output signal with a receiving part input signal, and, when a toggle or a transition is not detected in the receiving part input signal, simultaneously or sequentially perform operations of increasing voltage change time values of a rising edge of a transmission part output signal and the falling edge of the transmission part output signal, and decreasing a hysteresis range value for the receiving part input signal until the toggle or the transition is detected from the receiving part input signal.

When the self-calibration instruction is input, instructions may also instructions to transmit and receive predetermined reference signals, compare the transmission part output signal with the receiving part input signal, and, when a number of toggles or a number of transitions that are detected from the receiving part input signal is greater than a number of toggles or a number of transitions detected from the transmission part output signal, simultaneously or sequentially perform operations of increasing voltage change time values of the rising edge of the transmission part output signal and the falling edge of the transmission part output signal and decreasing a hysteresis range value for the receiving part input signal until the toggles or the transitions in the receiving part input signal are reduced and detected to be at a normal level.

In another general aspect, here is provided a method including outputting, by a microcomputer, a self-calibration instruction to a plurality of integrated circuits configured to perform isolated communication with respect to each other when a predetermined condition is met or in response to at least one of a periodic instruction or an aperiodic instruction and performing, by a processor disposed in each of the plurality of integrated circuits, self-calibration to transmission parts and receiving parts in each of the plurality of integrated circuits in response to the self-calibration instruction.

When the self-calibration instruction is input, the processor may be configured to change a level of a receiving part input signal by controlling voltage change times of a rising edge of a transmission part output signal and a falling edge of the transmission part output signal.

When the self-calibration instruction is input, the processor may be configured to control a hysteresis range for a receiving part input signal.

When the self-calibration instruction is input, the processor may be configured to select a transmission part and a receiving part connected to a signal line in which an error occurrence is not detected, from among the transmission parts and the receiving parts, in response to a current external environment, by controlling switches connecting the transmission parts and the receiving parts inside a respective one of the plurality of integrated circuits to different signal lines.

The plurality of integrated circuits may include a first pair including a first transmission part and a first receiving part, a second pair including a second transmission part and a second receiving part, and a switch device configured to select and to connect one of the first transmission part and the second transmission part and one of the first receiving part and the second receiving part to an isolated communication signal line.

The plurality of integrated circuits may include a first isolated communication integrated circuit and a second isolated communication integrated circuit connected to each other through a first pair of communication ports and a first signal line and a second signal line.

A first isolation device and a second isolation device may be provided at respective intermediate points of the first signal line and the second signal line, a third signal line and a fourth signal line may be connected to a second pair of communication ports of the first isolated communication integrated circuit, the third signal line and the fourth signal line being connected to respective first points of the first signal line and the second signal line upstream of a first capacitor and a second capacitor, respectively, through a third capacitor and a fourth capacitor, and a fifth signal line and a sixth signal line may be connected to a third pair of communication ports of the second isolated communication integrated circuit, the fifth signal line and the sixth signal line being connected to respective second points of the first signal line and the second signal line downstream of the first capacitor and the second capacitor, respectively, through a fifth capacitor and a sixth capacitor.

Each of the first transmission part and the second transmission part may include an edge time control circuit configured to control voltage change times of a rising edge of an output signal and a falling edge of the output signal.

Each of the first receiving part and the second receiving part may include a hysteresis range control circuit configured to control a hysteresis range for a received signal.

When the self-calibration instruction is input, the processor of each of the plurality of integrated circuits may be configured to execute instructions to transmit and receive predetermined reference signals, compare a transmission part output signal with a receiving part input signal, and when a toggle or a transition is not detected in the receiving part input signal, simultaneously or sequentially perform operations of increasing voltage change time values of a rising edge of the transmission part output signal and a falling edge of the transmission part output signal and decreasing a hysteresis range value for the receiving part input signal until the toggle or the transition is detected from the receiving part input signal.

When the self-calibration instruction is input, the processor of each of the plurality of integrated circuits may include instructions to transmit and receive predetermined reference signals, compare the transmission part output signal with the receiving part input signal, and, when a number of toggles or a number of transitions that are detected from the receiving part input signal is greater than a number of toggles or a number of transitions detected from the transmission part output signal, simultaneously or sequentially performs operations of increasing voltage change time values of a rising edge of the transmission part output signal and a falling edge of the transmission part output signal and decreasing a hysteresis range value for the receiving part input signal until the toggles or the transitions in the receiving part input signal are reduced and detected to be at a normal level.

Other features and aspects will be apparent from the following detailed description, the drawings, and the claims.

According to an aspect of the present disclosure, it is possible to prevent and compensate for data loss by self-calibration in response to changes in the external environment in isolated communication between integrated circuits (ICs).

BRIEF DESCRIPTION OF THE DRAWINGS

FIG. 6 is a flowchart illustrating a self-calibration method in isolated communication according to an embodiment of the present disclosure.

Figure 1:
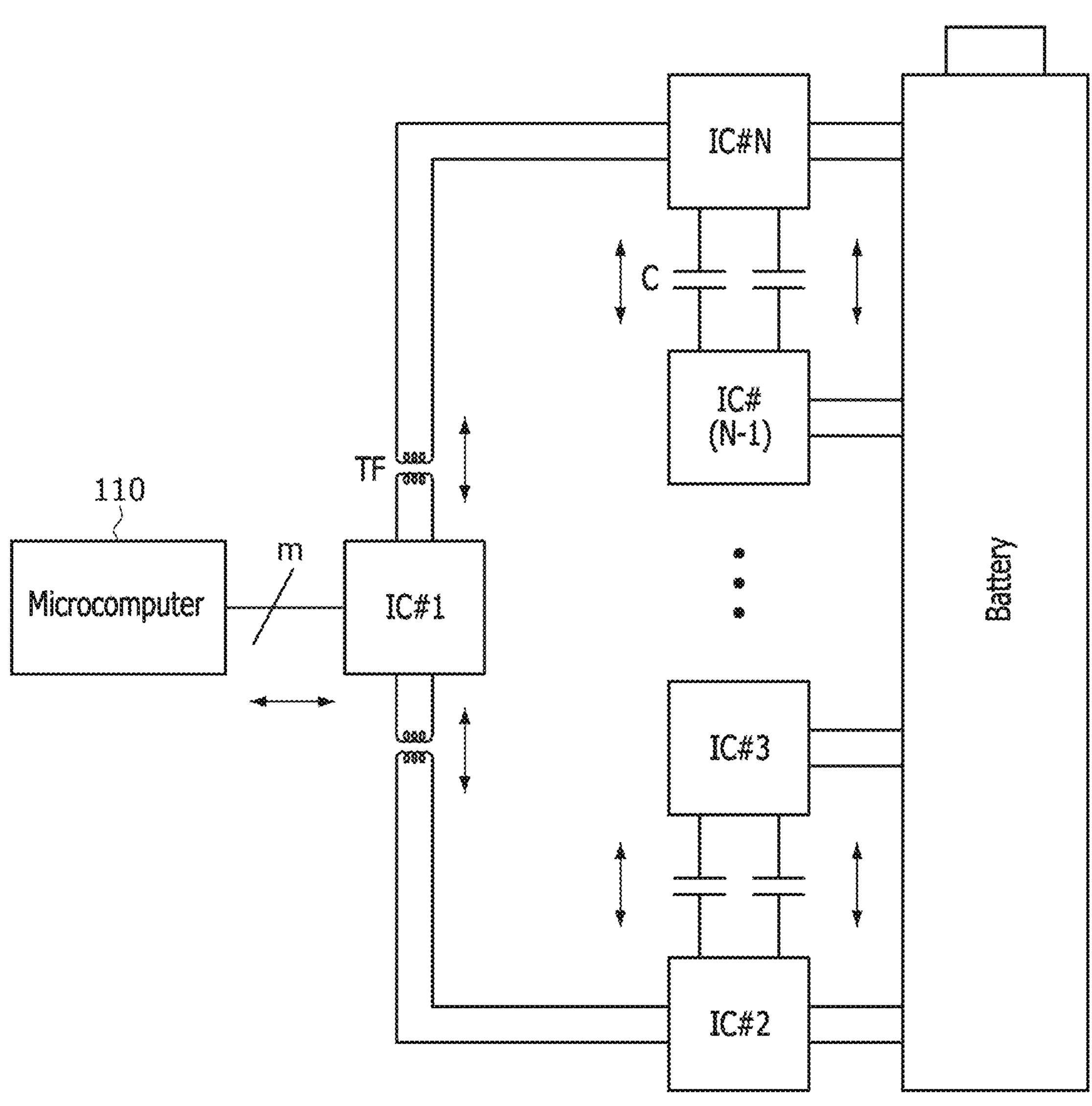
FIG. 1 is an example diagram illustrating a schematic configuration of a fuel cell system performing isolated communication related to an embodiment of the present disclosure.
Figure 2A:
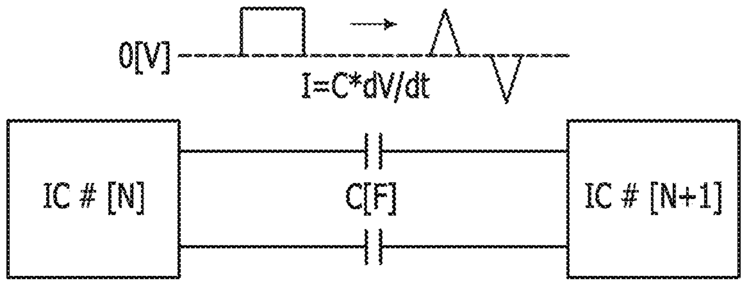
FIGS. 2A and 2B are example diagrams illustrating a problem that may occur in the fuel cell system illustrated in FIG. 1, due to changes in the capacitance of a capacitor serving as an isolation device in response to changes in the external environment.
Figure 2B:
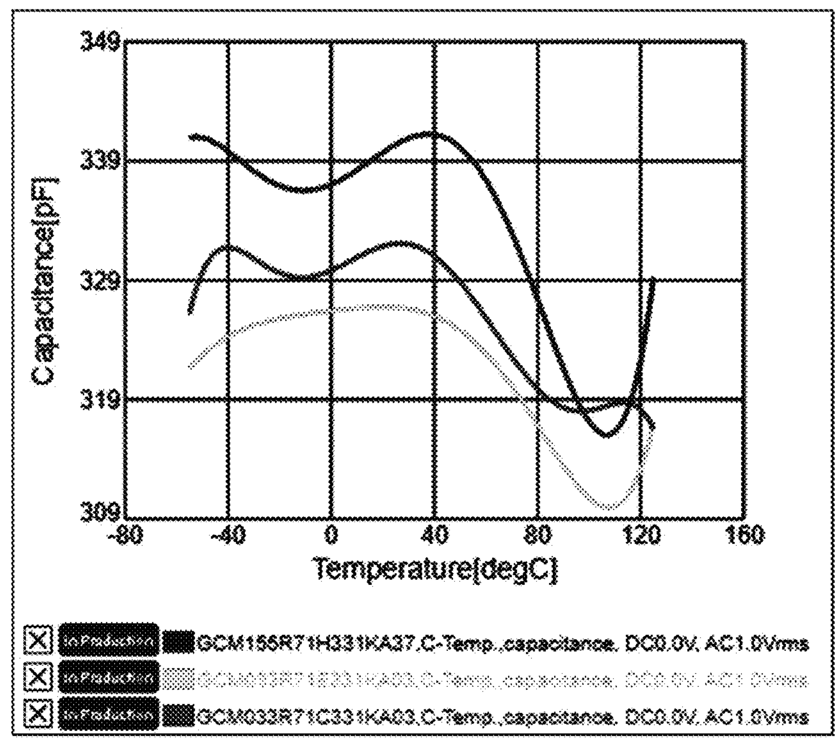

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION OF THE ILLUSTRATED EMBODIMENTS

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Advantages and features of the present disclosure and methods of achieving the advantages and features will be clear with reference to embodiments described in detail below together with the accompanying drawings. However, the present disclosure is not limited to the embodiments disclosed herein but will be implemented in various forms. The embodiments of the present disclosure are provided so that the present disclosure is completely disclosed, and a person with ordinary skill in the art can fully understand the scope of the present disclosure. The present disclosure will be defined only by the scope of the appended claims. Meanwhile, the terms used in the present specification are for explaining the embodiments, not for limiting the present disclosure.

Terms, such as first, second, A, B, (a), (b) or the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

In a description of the embodiment, in a case in which any one element is described as being formed on or under another element, such a description includes both a case in which the two elements are formed in direct contact with each other and a case in which the two elements are in indirect contact with each other with one or more other elements interposed between the two elements. In addition, when one element is described as being formed on or under another element, such a description may include a case in which the one element is formed at an upper side or a lower side with respect to another element.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Figure 3:
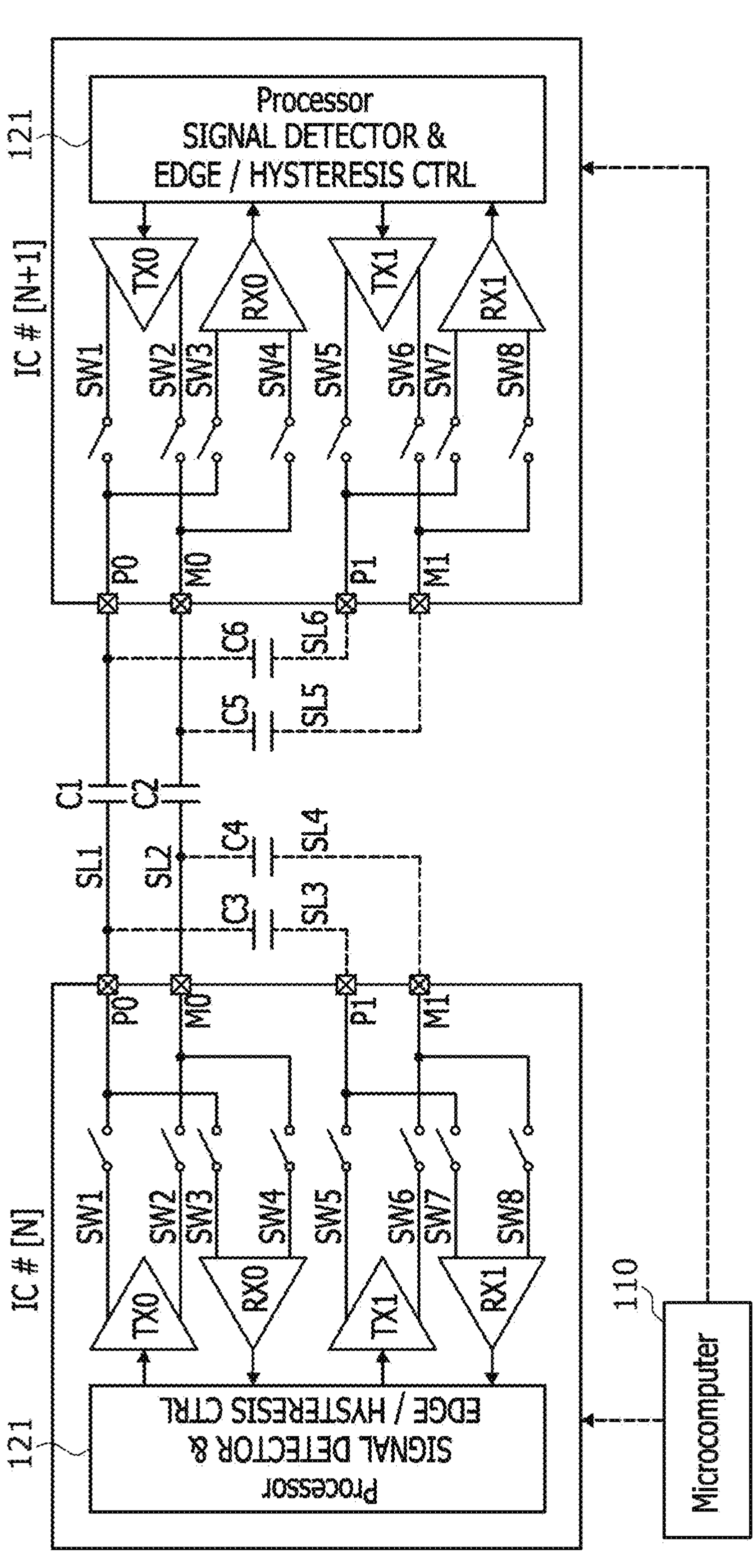
FIG. 3 is an example diagram illustrating a schematic configuration of an apparatus for self-calibration in isolated communication according to an embodiment of the present disclosure.
Figure 4A:
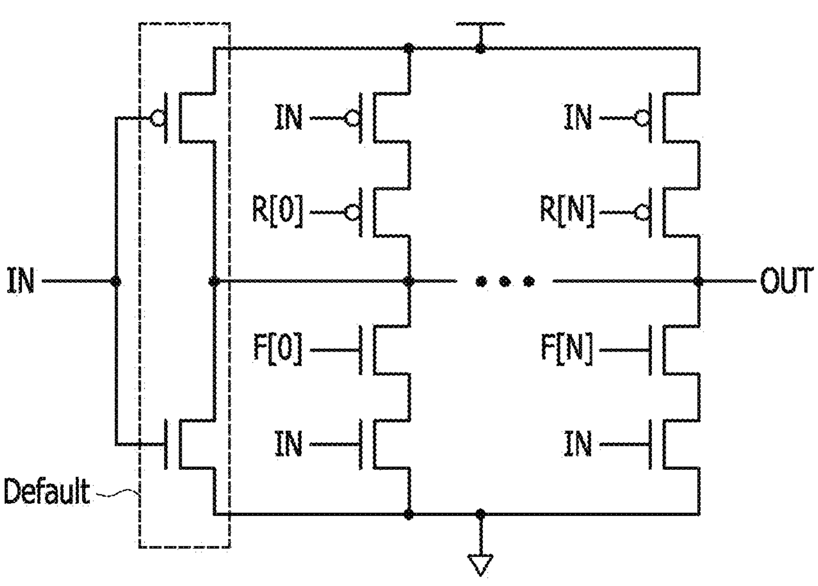
FIGS. 4A and 4B are example diagrams illustrating a schematic configuration of a voltage time control circuit of each of the transmission parts illustrated in FIG. 3.
Figure 4B:
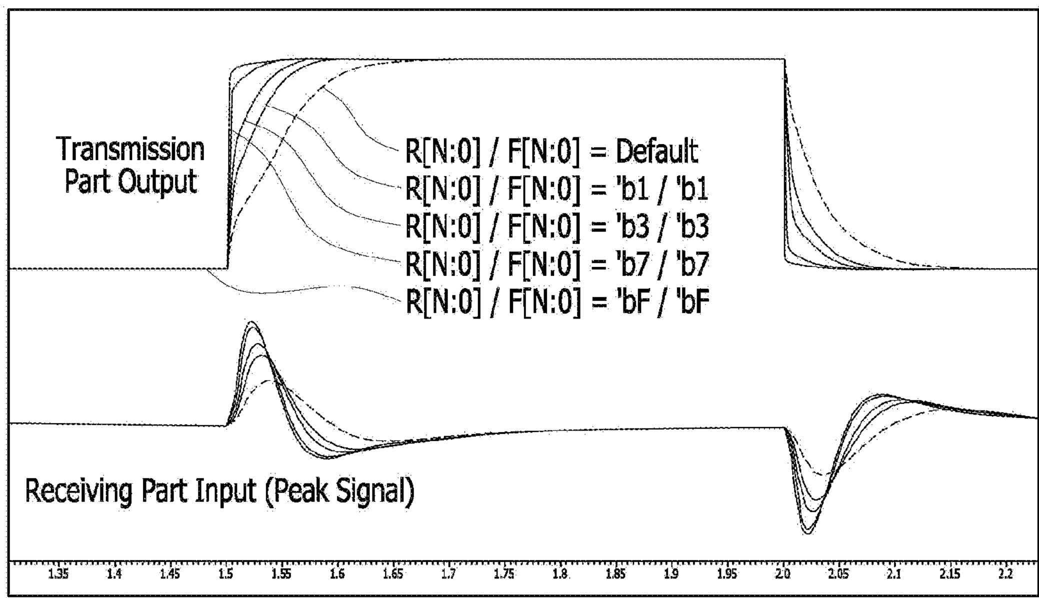
Figure 5A:
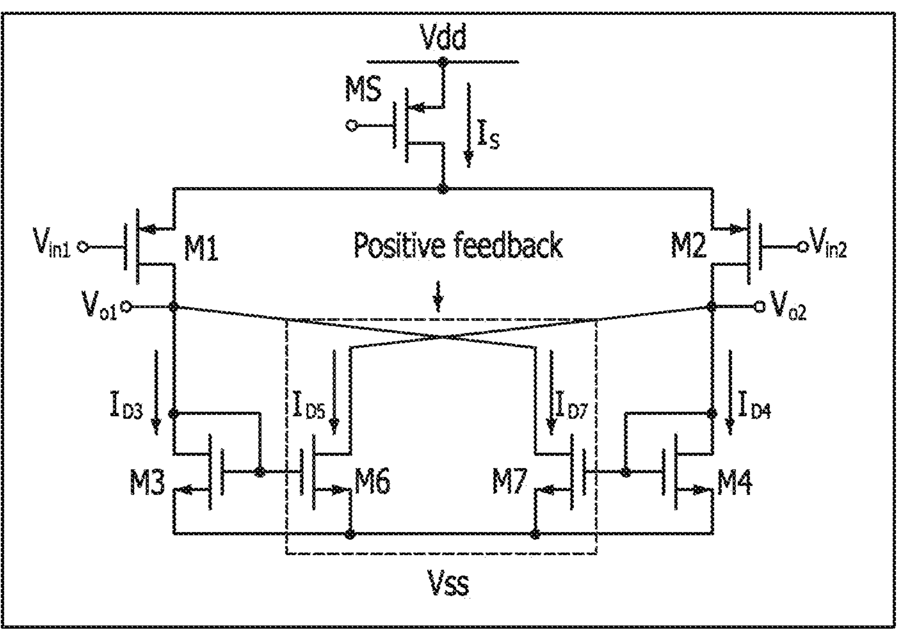
FIGS. 5A and 5B are example diagrams illustrating a schematic configuration of a hysteresis range control circuit of each of the receiving parts illustrated in FIG. 3.
Figure 5B:
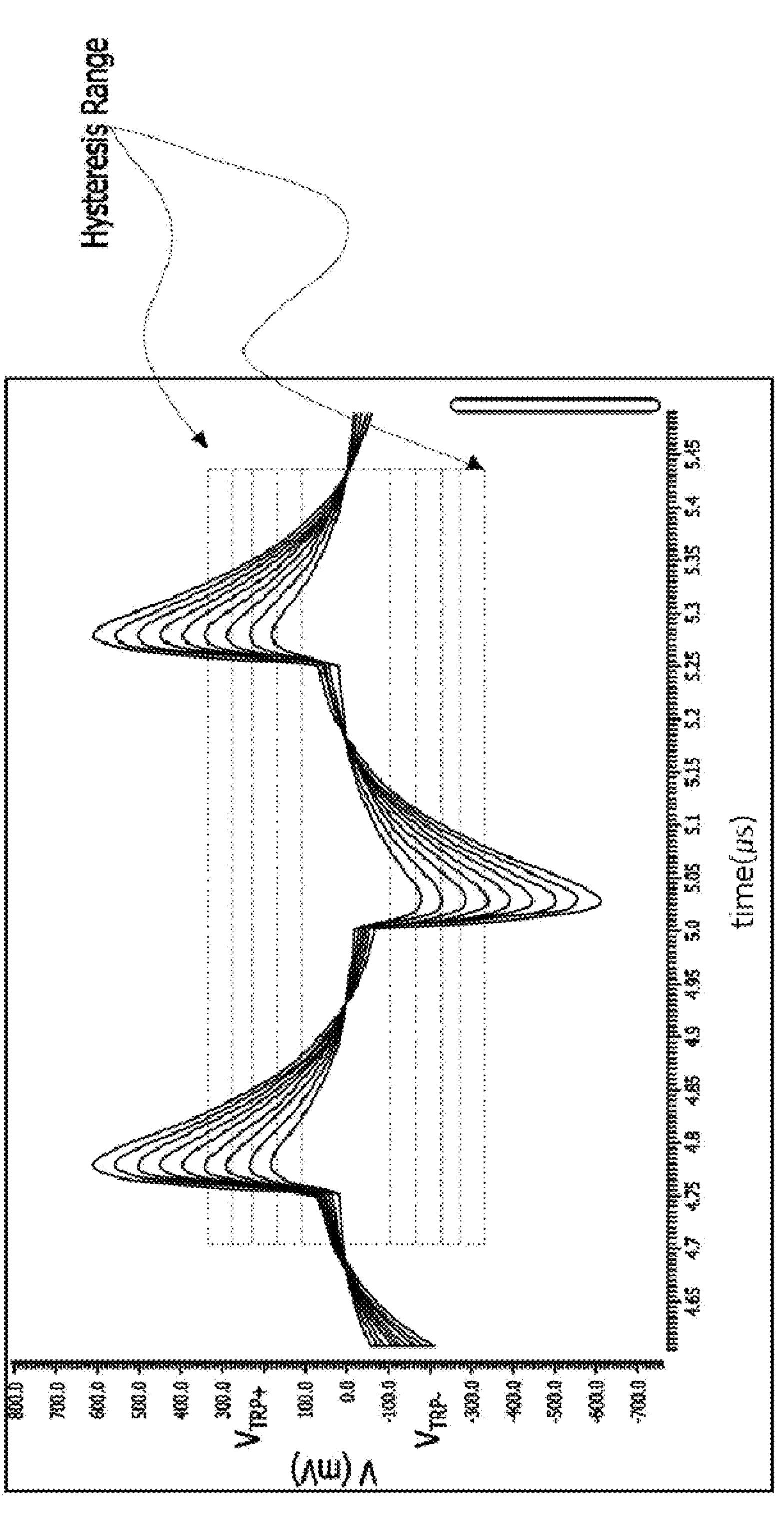

FIG. 3 is an example diagram illustrating a schematic configuration of an apparatus for self-calibration in isolated communication according to an embodiment of the present disclosure, FIGS. 4A and 4B are example diagrams illustrating a schematic configuration of a voltage time control circuit of each of transmission parts TX0 and TX1 illustrated in FIG. 3, FIGS. 5A and 5B are example diagrams illustrating a schematic configuration of a hysteresis range control circuit of each of receiving parts RX0 and RX1 illustrated in FIG. 3, and FIG. 6 is a flowchart illustrating a self-calibration method in isolated communication according to an embodiment of the present disclosure.

Referring to FIG. 3, the apparatus for self-calibration in isolated communication according to the present disclosure includes a pair of transmission parts TX0 and a pair of receiving parts RX0 disposed as default inside isolated communication integrated circuits IC #[N] and IC #[N+1] and a pair of transmission parts TX1 and a pair of receiving parts RX1. The apparatus for self-calibration in isolated communication also includes switches SW1 to SW8 and processors 121. The switches SW1 to SW8 are capable of selecting connections of the transmission parts TX0 and TX1 and the receiving parts RX0 and RX1 to signal lines. Each of the processors 121 selects one transmission part TX0 or TX1 and one receiving part RX0 or RX1 among the transmission parts TX0 and TX1 and the receiving parts RX0 and RX1 connected to signals lines having no errors by controlling the switches SW1 to SW8, transmits signals (i.e., data) to another integrated circuit of the integrated circuits IC #[N] and IC #[N+1] and receives signals therefrom, and controls an edge time (e.g., a voltage change time) of a signal (i.e., data) transmitted by the selected transmission part TX0 or TX1 and a hysteresis range of a signal received by the selected receiving part RX0 or RX1.

The isolated communication integrated circuits IC #[N] and IC #[N+1] transmitting and receiving signals (i.e., data) have the same internal components (e.g., the processor, the first and second transmission parts, and the first and second receiving parts of the isolated communication integrated circuit IC #[N] are the same as those of the isolated communication integrated circuit IC #[N+1]). First and second signal lines SL1 and SL2 are connected to the isolated communication integrated circuit IC #[N] through one pair of communication ports P0 and M0 and the isolated communication integrated circuit IC #[N+1] through one pair of communication ports P0 and M0. First and second capacitors C1 and C2 are provided at intermediate points of the first and second signal lines SL1 and SL2, respectively, as isolation devices.

In addition, third and fourth signal lines SL3 and SL4 connected to another pair of communication ports P1 and M1 of the isolated communication integrated circuit IC #[N] are connected to points of the first and second signal lines SL1 and SL2 upstream of the first and second capacitors C1 and C2, respectively, through third and fourth capacitors C3 and C4, whereas fifth and sixth signal lines SL5 and SL6 connected to another pair of communication ports P1 and M1 of the isolated communication integrated circuit IC #[N+1] are connected to points of the first and second signal lines SL1 and SL2 downstream of the first and second capacitors C1 and C2, respectively, through fifth and sixth capacitors C5 and C6.

Here, the first and second capacitors C1 and C2, the third and fourth capacitors C3 and C4, and the fifth and sixth capacitors C5 and C6 may not have the same capacitance.

In addition, the capacitance of the entirety of the capacitors may be adjusted according to signal lines connected to the corresponding transmission part TX0 or TX1 and the corresponding receiving part RX0 or RX1 by the control of the switches SW1 to SW8 by the processors 121.

That is, since the capacitor capacitance varies according to the signal line selected by the control of the switches SW1 to SW8, a signal line configured with the capacitor capacitance suitable to the changed external environment (e.g., temperature) may be selected.

Here, the operation (e.g., ① an operation of selecting a specific transmission part and a specific receiving part for transmitting and receiving signals to and from another integrated circuit by controlling the switches SW1 to SW8, ② an operation of controlling the edge time of a signal transmitted by the selected transmission part, and ③ an operation of controlling a hysteresis range for a signal received by the selected receiving part) performed by each of the processors 121 is a self-calibration operation performed when a predetermined condition (e.g., a set temperature condition) is met or in response to a periodic or aperiodic self-calibration instruction by the microcomputer 110 (e.g., the periodic self-calibration instruction is generated before communication is performed, and the aperiodic self-calibration instruction is generated at any point in time while the communication is being performed).

Meanwhile, each of the transmission parts TX0 and TX1 includes an edge time control circuit as illustrated in FIGS. 4A and 4B to perform the edge time control operation during the self-calibration operation. In addition, each of the receiving parts RX0 and RX1 includes a hysteresis range control circuit as illustrated in FIGS. 5A and 5B to perform the hysteresis range control operation during the self-calibration operation.

Here, the edge time control circuit illustrated in FIGS. 4A and 4B and the hysteresis range control circuit illustrated in FIGS. 5A and 5B are illustrative only, and neither the edge time control circuit nor the hysteresis range control circuit according to the present disclosure is limited thereto.

Thus, hereinafter, the circuit configuration will be described in brief, and functional operations will be mainly described.

Referring to FIG. 4A, at a rising edge of an input signal IN, rising edge time control (e.g., voltage change time control) is performed by selectively turning a P-type metal-oxide-semiconductor field-effect transistor (MOSFET) on/off by R[0] to R[N]. At a falling edge of the input signal IN, falling edge time control (e.g., voltage change time control) is performed by selectively turning an N-type MOSFET on/off by F[0] to F[N].

In FIG. 4A, the rising edge time control and the falling edge time control are performed by the selective turning on/off of the P-type MOSFET or the N-type MOSFET. Thus, as illustrated in FIG. 4B, when a transmission part output signal is referred to as, it can be appreciated that the edge time control (e.g., voltage change time control) is gradually performed from a default edge time (indicated with a red line).

In addition, it can be appreciated the level of the input signal (i.e., peak signal) of the receiving part changes (i.e., increases or decreases in response to the rising edge time control and the falling edge time control (e.g., voltage change time control).

For example, it can be appreciated that the level of the receiving part input signal (i.e., peak signal) is lowered with increases in a rising edge time and a falling edge time (e.g., voltage change times) of the transmission part output signal, and that the level of the receiving part input signal (i.e., peak signal) is raised with decreases in the edge time (e.g., voltage change time) of the transmission part output signal.

Meanwhile, as described above, FIG. 5A is an example diagram illustrating the hysteresis range control circuit. A plurality of positive feedback circuits may be respectively formed in a box-shaped portion indicated with dotted lines. N-type MOSFETs M6 and M7 inside each of the positive feedback circuits may be selectively turned on/off so as to widen or narrow the hysteresis range for the receiving part input signal (i.e., peak signal) as illustrated in FIG. 5B.

Consequently, when the level of the receiving part input signal (i.e., peak signal) is within the hysteresis range, the receiving part input signal (i.e., peak signal) is neglected (i.e., the reception of the signal is not recognized since the signal is not togged or transited). Thus, the hysteresis range should to be lower than the level of a normal signal (i.e., a voltage level) for normal signal reception.

When the level of the receiving part input signal (i.e., peak signal) is outside of the hysteresis range, the receiving part input signal (i.e., peak signal) is recognized (i.e., the reception of the signal is recognized since the signal is togged or transited). Thus, the hysteresis range should to be higher than the level of a noise signal for normal signal reception when a large amount of noise is included (e.g., a large amount of toggle occurs).

As described above, the processors 121 may control the rising edge time and the falling edge time (e.g., voltage change times) of the transmission part output signal in response to the self-calibration instruction by the microcomputer 110, thereby changing (i.e., increasing or decreasing) the level of the receiving part input signal (i.e., peak signal).

In addition, the processors 121 may control the hysteresis range for the receiving part input signal in response to the self-calibration instruction by the microcomputer 110, thereby only receiving normal signals except for noise.

In addition, the processors 121 may select one transmission part and one receiving part connected to a signal line having no errors by controlling the switches SW1 to SW8 inside the integrated circuit in response to the self-calibration instruction by the microcomputer 110, thereby allowing the integrated circuit to transmit and receive signals to and from another integrated circuit.

Hereinafter, a self-calibration method in isolated communication according to an embodiment of the present disclosure will be described with reference to FIG. 6.

Referring to FIG. 6, when the processors 121 receive a self-calibration instruction from the microcomputer 110 in S101, the processor 121 of each of the integrated circuits IC #[N] and IC #[N+1] compares a transmission part output signal with a receiving part input signal by transmitting and receiving predetermined reference signals (e.g., reference pulse signals) in S102.

As a result of the comparison of the transmission part output signal with the receiving part input signal, when there has been no toggle (or transition) in the receiving part input signal for a specific time (e.g., when a hysteresis range is higher than the level of a normal signal) in S103, the processor 121 increases values of a rising edge time and a falling edge time (e.g., voltage change times) of the transmission part output signal in S104, and then repeats the operation S103 of determining whether or not there has been a toggle (or transition) in the receiving part input signal for the specific time.

In addition, when there has been no toggle (or transition) in the receiving part input signal for the specific time in S103, the processor 121 decreases a value of hysteresis range for the receiving part input signal in S105, and repeats the operation S103 of determining whether or not there has been a toggle (or transition) in the receiving part input signal for the specific time.

Here, the operations S104 and S105 may be performed simultaneously, or may be performed sequentially, one after the other.

When the toggle (or transition) in the receiving part input signal is detected through the operations S103 to S105, the processor 121 completes the setting of the transmission part and the receiving part (i.e., the self-calibration) and starts normal communication in S106.

Meanwhile, as a result of the comparison of the transmission part output signal with the receiving part input signal, when the receiving part input signal has more toggles (or transitions) than the transmission part output signal (e.g., when the hysteresis range is lower than the level of a noise signal) in S107, the processors 121 decreases values of the rising edge time and the falling edge time (e.g., voltage change times) of the transmission part output signal in S108, and then repeats the operation S107 of determining whether or not the receiving part input signal has more toggles (or transitions) than the transmission part output signal.

In addition, when more toggles (or transitions) are detected from the receiving part input signal than from the transmission part output signal in S107, the processor 121 increases the value of hysteresis range for the receiving part input signal in S109, and then repeats the operation S107 of determining whether or not more toggles (or transitions) are detected from the receiving part input signal than from the transmission part output signal.

Here, the operations S108 and S109 may be performed simultaneously, or may be performed sequentially, one after the other.

When toggles (or transitions) in the receiving part input signal are reduced through the operations S108 to S109 so as to be detected to be at a normal level, the processor 121 completes the setting of the transmission part and the receiving part (i.e., the self-calibration) and starts normal communication in S110.

As described above, in isolated communication between integrated circuits (ICs), the present embodiment may prevent and compensate for data loss by self-calibration of performing the edge time control (e.g., the voltage change time control) to the transmission part output signal and performing the hysteresis range control to the receiving part input signal in order to prevent transmission/reception data from being lost due to changes in the external environment (e.g., temperature). Consequently, optimum signal transmission/reception states may be set, thereby improving communication performance.

In addition, according to the present embodiment, the voltage change time control function of the transmission part and the hysteresis range control function of the receiving part are installed in the integrated circuits (ICs). Thus, an effect capable of reducing the number of components and the cost of a controller may be obtained.

Various embodiments of the present disclosure do not list all available combinations but are for describing a representative aspect of the present disclosure, and descriptions of various embodiments may be applied independently or may be applied through a combination of two or more.

Moreover, various embodiments of the present disclosure may be implemented with hardware, firmware, software, or a combination thereof. In a case where various embodiments of the present disclosure are implemented with hardware, various embodiments of the present disclosure may be implemented with one or more application specific integrated circuits (ASICs), digital signal processors (DSPs), digital signal processing devices (DSPDs), programmable logic devices (PLDs), field programmable gate arrays (FPGAs), general processors, controllers, microcontrollers, or microprocessors.

The scope of the present disclosure may include software or machine-executable instructions (for example, an operation system (OS), applications, firmware, programs, etc.), which enable operations of a method according to various embodiments to be executed in a device or a computer, and a non-transitory computer-readable medium capable of being executed in a device or a computer each storing the software or the instructions.

A number of embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus, comprising:

a plurality of integrated circuits configured to perform isolated communication with respect to each other;

a microcomputer configured to output a self-calibration instruction to the plurality of integrated circuits when a predetermined condition is met or in response to one of a periodic instruction or aperiodic instruction; and a plurality of processors each provided in a corresponding one of the plurality of integrated circuits, the plurality of processors being configured to execute instructions to perform a self-calibration operation to transmission parts and receiving parts in the corresponding integrated circuit, wherein, when the self-calibration instruction is input, the instructions further comprise instructions to change a level of a receiving part input signal by controlling voltage change times of a rising edge of a transmission part output signal and a falling edge of the transmission part output signal.

2. An apparatus, comprising:

a plurality of integrated circuits configured to perform isolated communication with respect to each other;

a microcomputer configured to output a self-calibration instruction to the plurality of integrated circuits when a predetermined condition is met or in response to one of a periodic instruction or aperiodic instruction; and a plurality of processors each provided in a corresponding one of the plurality of integrated circuits, the plurality of processors being configured to execute instructions to perform a self-calibration operation to transmission parts and receiving parts in the corresponding integrated circuit, wherein, when the self-calibration instruction is input, the instructions further comprise instructions to control a hysteresis range for a receiving part input signal.

3. The apparatus of claim 1, wherein, when the self-calibration instruction is input, the instructions further comprise instructions to select a transmission part and a receiving part connected to a signal line in which an error occurrence is not detected, from among the transmission parts and the receiving parts, in response to a current external environment, by controlling switches connecting the transmission parts and the receiving parts inside one of the plurality of integrated circuits to different signal lines.

4. The apparatus of claim 1, wherein the plurality of integrated circuits comprise:

a pair of first transmission parts and a pair of first receiving parts;

a pair of second transmission parts and a pair of second receiving parts; and a switch device configured to select and connect one of the first transmission parts and the second transmission parts and one of the 28 first receiving parts and the second receiving parts to an isolated communication signal line.

5. The apparatus of claim 1, wherein the plurality of integrated circuits comprise a first isolated communication integrated circuit and a second isolated communication integrated circuit connected to each other through a first pair of communication ports and a first signal line and a second signal line, wherein a first isolation device and a second isolation device are provided at respective intermediate points of the first signal line and the second signal line, a third signal line and a fourth signal line connected to a second pair of communication ports of the first isolated communication integrated circuit, the third signal line and the fourth signal line being connected to respective first points of the first signal line and the second signal line upstream of the first isolation device and the second isolation device through a third capacitor and a fourth capacitor, respectively, and a fifth signal line and a sixth signal line connected to a third pair of communication ports of the second isolated communication integrated circuit, the fifth signal line and the sixth signal line being connected to respective second points of the first signal line and the second signal line downstream of the first isolation device and the 29 second isolation device, respectively, through a fifth capacitor and a sixth capacitor.

6. The apparatus of claim 4, wherein each of the first transmission parts and the second transmission parts comprise an edge time control circuit configured to control voltage change times of a rising edge of an output signal and a falling edge of the output signal.

7. The apparatus of claim 4, wherein each of the first receiving parts and the second receiving parts comprise a hysteresis range control circuit configured to control a hysteresis range for a received signal.

8. The apparatus of claim 1, wherein, when the self-calibration instruction is input, the instructions further comprise instructions to:

transmit and receive predetermined reference signals;

compare a transmission part output signal with a receiving part input signal; and when a toggle or a transition is not detected in the receiving part input signal, simultaneously or sequentially perform operations of:

increasing voltage change time values of a rising edge of a transmission part output signal and a falling edge of the transmission part output signal; and decreasing a hysteresis range value for the receiving part input signal until the toggle or the transition is detected from the receiving part input signal.

9. The apparatus of claim 1, wherein, when the self-calibration instruction is input, instructions further comprise instructions to:

transmit and receive predetermined reference signals;

compare the transmission part output signal with the receiving part input signal; and when a number of toggles or a number of transitions that are detected from the receiving part input signal is greater than a number of toggles or a number of transitions detected from the transmission part output signal, simultaneously or sequentially perform operations of:

increasing voltage change time values of the rising edge of the transmission part output signal and the falling edge of the transmission part output signal; and decreasing a hysteresis range value for the receiving part input signal until the toggles or the transitions in the receiving part input signal are reduced and detected to be at a normal level.

10. A method, the method comprising:

outputting, by a microcomputer, a self-calibration instruction to a plurality of integrated circuits configured to perform isolated communication with respect to each other when a predetermined condition is met or in response to at least one of a periodic instruction or an aperiodic instruction; and performing, by a processor disposed in each of the plurality of integrated circuits, self-calibration to transmission parts and receiving parts in each of the plurality of integrated circuits in response to the self-calibration instruction, wherein, when the self-calibration instruction is input, the processor is configured to change a level of a receiving part input signal by controlling voltage change times of a rising edge of a transmission part output signal and a falling edge of the transmission part output signal.

11. The method of claim 10, wherein, when the self-calibration instruction is input, the processor is configured to control a hysteresis range for a receiving part input signal.

12. The method of claim 10, wherein, when the self-calibration instruction is input, the processor is configured to select a transmission part and a receiving part connected to a signal line in which an error occurrence is not detected, from among the transmission parts and the receiving parts, in response to a current external environment, by controlling switches connecting the transmission parts and the receiving parts inside a respective one of the plurality of integrated circuits to different signal lines.

13. The method of claim 10, wherein the plurality of integrated circuits comprise:

a first pair comprising a first transmission part and a first receiving part;

a second pair comprising a second transmission part and a second receiving part; and a switch device configured to select and to connect one of the first transmission part and the second transmission part and one of the first receiving part and the second receiving part to an isolated communication signal line.

14. The method of claim 10, wherein the plurality of integrated circuits comprise a first isolated communication integrated circuit and a second isolated communication integrated circuit connected to each other through a first pair of communication ports and a first signal line and a second signal line, wherein a first isolation device and a second isolation device are provided at respective intermediate points of the first signal line and the second signal line, a third signal line and a fourth signal line connected to a second pair of communication ports of the first isolated communication integrated circuit, the third signal line and the fourth signal line being connected to respective first points of the first signal line and the second signal line upstream of a first capacitor and a second capacitor, respectively, through a third capacitor and a fourth capacitor, and a fifth signal line and a sixth signal line connected to a third pair of communication ports of the second isolated communication integrated circuit, the fifth signal line and the sixth signal line being connected to respective second points of the first signal line and the second signal line downstream of the first capacitor and the second capacitor, respectively, through a fifth capacitor and a sixth capacitor.

15. The method of claim 13, wherein each of the first transmission part and the second transmission part comprises an edge time control circuit configured to control voltage change times of a rising edge of an output signal and a falling edge of the output signal.

16. The method of claim 13, wherein each of the first receiving part and the second receiving part comprises a hysteresis range control circuit configured to control a hysteresis range for a received signal.

17. The method of claim 10, wherein, when the self-calibration instruction is input, the processor of each of the plurality of integrated circuits is configured to execute instructions to:

transmit and receive predetermined reference signals;

compare a transmission part output signal with a receiving part input signal; and when a toggle or a transition is not detected in the receiving part input signal, simultaneously or sequentially perform operations of:

increasing voltage change time values of a rising edge of the transmission part output signal and a falling edge of the transmission part output signal; and decreasing a hysteresis range value for the receiving part input signal until the toggle or the transition is detected from the receiving part input signal.

18. The method of claim 10, wherein, when the self-calibration instruction is input, the processor of each of the plurality of integrated circuits is configured to execute instructions to:

transmit and receive predetermined reference signals;

compare the transmission part output signal with the receiving part input signal; and when a number of toggles or a number of transitions that are detected from the receiving part input signal is greater than a number of toggles or a number of transitions detected from the transmission part output signal, simultaneously or sequentially performs operations of:

increasing voltage change time values of a rising edge of the transmission part output signal and a falling edge of the transmission part output signal; and decreasing a hysteresis range value for the receiving part input signal until the toggles or the transitions in the receiving part input signal are reduced and detected to be at a normal level.

* * * * *